(12) United States Patent
Ershov

(10) Patent No.: US 6,240,110 B1
(45) Date of Patent: May 29, 2001

(54) LINE NARROWED $F_2$ LASER WITH ETALON BASED OUTPUT COUPLER

(75) Inventor: Alexander I. Ershov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/407,120

(22) Filed: Sep. 27, 1999

Related U.S. Application Data

(63) Continuation-in-part of application No. 09/217,340, filed on Dec. 21, 1998, which is a continuation-in-part of application No. 08/869,239, filed on Jun. 4, 1997, now Pat. No. 5,856,991, which is a continuation-in-part of application No. 08/886,715, filed on Jul. 1, 1997, which is a continuation-in-part of application No. 08/926,721, filed on Sep. 10, 1997, now Pat. No. 5,852,627, and a continuation-in-part of application No. 08/987,127, filed on Dec. 8, 1997, now Pat. No. 5,901,163.

(51) Int. Cl.$^7$ .................................................. H01S 3/098
(52) U.S. Cl. .............................. 372/20; 372/57; 372/102
(58) Field of Search ........................... 372/20, 57, 97, 372/102, 108

(56) References Cited

U.S. PATENT DOCUMENTS

| | | | |
|---|---|---|---|
| 4,985,898 | * 1/1991 | Furuya et al. | 372/102 |
| 5,150,370 | * 9/1992 | Furuya et al. | 372/57 |
| 5,852,627 | * 12/1998 | Ershov | 372/92 |
| 5,856,991 | 1/1999 | Ershov | 372/57 |
| 5,978,406 | * 11/1999 | Rokni et al. | 372/57 |

OTHER PUBLICATIONS

McKee; "Spectral–narrowing techniques for excimer laser oscillators";Canadian J. of Phys. vol. 63,pp. 214–219,(1983).*

Hooker et al; "Influence of cavity configuration on the pulse energy of a high pressure molecular fluorine laser"; Appl k. Phys. B 55,pp 54–59,(1992).*

Isshchenko et al; "High power efficient vacuum F/2 laser excited by electric discharge";Sov. J. Quantum Electron.15(5), pp. 707–709,May 1996.*

Jenkins, Francis A. and White, Harvey, E., "Fundamentalsof Optics", McGraw–HillBook Company,Fourth Edition, Copyright 1957, 1976, pp. 297–299.

Hercher, Michael, "Tunable Single Mode Operation of Gas Lasers Using Intracavity Tilted Etalons", Applied Optics, vol. 8, No. 6, Jun. 1969, pp. 1103–1106.

Reintjes, John F., "Laser Handbook", Elsevier Science Publishers, B.V., 1985, pp. 44–50.

* cited by examiner

Primary Examiner—Leon Scott, Jr.
(74) Attorney, Agent, or Firm—John R. Ross, Esq.

(57) ABSTRACT

An $F_2$ laser having an etalon-based line narrowing output coupler and a technique for tuning the laser. The etalon based output coupler is adjusted to preferentially reflect a percentage of light at or near the spectral maximum of one of the primary $F_2$ spectral lines and to not reflect light at the other primary $F_2$ spectral line. Thus, a selected range of the selected line is preferentially amplified in the gain medium and the other line is transmitted out of the laser cavity and, therefore, receives no amplification and is suppressed. The result is substantial narrowing in the preferred embodiment of the 157.630 nm line and effective suppression of the 157.523 nm line. Substantial improvement in line narrowing of 157.630 nm line results from a wavelength selective properties of etalon based line-narrowing output coupler.

23 Claims, 6 Drawing Sheets

LINE NARROWED F₂ LASER WITH ETALON BASED OUTPUT COUPLER

This application is a continuation-in-part application of U.S. Ser. No. 09/217,340, filed Dec. 21, 1998 which is a continuation-in-part of U.S. Ser. No. 08/869,239, filed Jun. 4, 1997, now U.S. Pat. No. 5,856,991; U.S. Ser. No. 08/886,715, filed Jul. 1, 1997; U.S. Ser. No. 08/926,721, filed Sep. 10, 1997, now U.S. Pat. No. 5,852,627; and U.S. Ser. No. 08/987,127, filed Dec. 8, 1997, now U.S. Pat. No. 5,901,163. This invention relates to line narrowed lasers and especially to etalon-based line narrowed lasers.

BACKGROUND OF THE INVENTION

TECHNIQUES FOR LINE NARROWING

Techniques for decreasing the bandwidth of the output of lasers are well known. Several such techniques used on excimer lasers are discussed by John F. Reintjes at pages 44–50 in *Laser Handbook*, Vol. 5, North-Holland Physics Publishing, Elsevier Science Publishers B.V. These techniques include the utilization of gratings, including echelle gratings for wavelength selection. Use of beam expanding prisms ahead of the grating can increase the effectiveness of the grating.

A prior art narrow band KrF excimer laser is shown in FIG. 1. The resonance cavity of excimer laser 2 is formed by output coupler 4 (which is a partially reflecting mirror) and echelle grating 16. A portion of the laser output beam 20 (having a cross section of about 3 mm in the horizonal direction and 20 mm in the vertical direction) exits the rear of laser chamber 3. This portion of the beam is expanded in the horizonal direction by prisms 8, 10 and 12 and reflected by mirror 14 onto echelle grating 16. Mirror 14 is pivoted to select the narrow band output for laser 2. Grating 16 is arranged in Littrow configuration so that the selected narrow band of wavelengths is reflected back off mirror 14 and back through prisms 12, 10 and 8 and into chamber 3 for amplification. Light at wavelengths outside the selected narrow band is disbursed so that this disbursed out-of-band light is not reflected back into the laser chamber. Total beam expansion for this laser is about 20X. The beam has a horizontal polarization (P-polarization for the prisms with the actual surface arranged vertically). Typical KrF lasers operating in a pulse mode may have a cavity length of about 1 m and produce pulses having a duration of about 15 to 25 ns. Thus, photons within the resonance cavity will make, on the average, about 3 to 5 round trips within the cavity. On each round trip, about 90 percent of the beam exits at the output coupler and about 10 percent is sent back for further amplification and line narrowing. The beam is repeatedly line narrowed as it passes through the line narrowing module.

With this prior art arrangement, the bandwidth of the KrF laser is reduced from its natural bandwidth of about 300 pm (full width half maximum or FWHM) to about 0.8 pm for KrF lasers and about 0.6 pm for ArF lasers.

Some applications of KrF lasers, however, require greater narrowing of the bandwidth. There is a need for smaller bandwidths such as FWHM values of 0.5 pm and 0.4 pm for KrF and ArF, respectively.

One prior art method is to add an etalon within the resonance cavity. In this case, the etalon is operated in a transmissive mode and the light is additionally line narrowed as it passes through the etalon. In such system one should use a relatively high finesse etalon, with a finesse value $f$ of about 1 or higher which produces sharp fringe patterns. The finesse value $f$ is determined by the equation:

$$f = \pi r^{1/2}/(1-r)$$

where r is the reflectivity of the etalon surfaces. The dependence of etalon transmission spectrum on r is shown graphically in FIG. 2 which is extracted from page 298 of *Fundamentals of Optics* by Jenkins and White, published by McGraw Hill. From FIG. 2, it is obvious why prior art transmissive etalons used for line narrowing have surfaces with reflectance of about 50% to 80% (see curves B and C of FIG. 2). FIG. 2 also shows that it would not be practical to use curve A-type low finesse etalon as it line-narrowing efficiency in this prior art arrangement would be very low. Prior art high finesse etalons used with diffraction gratings should enhance the line-narrowing capabilities provided by diffraction grating, and in general, improve the laser linewidth. The major disadvantages of this technique are that the many reflections within the etalon tend to heat up the etalon producing distortions and that the tuning of the etalon synchronously with the grating does present a real technical challenge and is difficult to accomplish in practice.

$F_2$ gas molecular laser will likely be a successor to KrF and ArF excimer lasers as a production light source for next generation microlithography, enabling printing circuits with features as small as 50–70 nm. It is chosen for that purpose because of the very short wavelength of its output beam, which is about 157 nmn, as compared to currently used KrF and ArF excimer lasers, which produce beams with wavelengths of about 248 nm and 193 nm respectively. Narrowband versions of these lasers are currently used in semiconductor microlithography for printing circuits with smallest features in the range of 250 to 100 nm. The shorter wavelength of F2 molecular laser permits much more tighter focusing and as a result, smaller features in the range of 50–70 nm can be printed.

However, all the available materials transparent at 157 nm have a significant dispersion in that region. Because of that, different portions of the laser beam, having slightly different wavelengths, will be focused by imaging lens onto different spots, so the image blurs. As a result, there is a tight requirement that the bandwidth of $F_2$ laser should be as small as possible. The estimations of possible lens designs show, that the bandwidth of $F_2$ laser should be about 0.2 to 0.5 pm at full-width half-maximum level (FWHM).

Unfortunately, the free running $F_2$ laser generates two lines, the stronger line at 157.630 nm and a weaker line at 157.523 nm. The separation between these two lines is about 107 nm which is much larger than the FWHM specification of 0.2 to 0.5 pm. Each line has a bandwidth of about 1.2 pm, which is also significantly higher than the required FWHM. Therefore, in order for $F_2$ laser to succeed in microlithography, its spectrum has to be line-narrowed. The weaker line should be suppressed as much as feasible, and the stronger line should be line-narrowed by at least ⅓ times.

One of the first choice for line-narrowing technique for $F_2$ laser might be diffraction grating-based technique, described above in FIG. 1, because this technique has been already proven in KrF and ArF excimer lasers to deliver linenarrowed pulses with pulse energy in the range of 5–10 mJ.

Unfortunately, when this technique is applied for $F_2$ laser line-narrowing, the pulse energy output becomes very small. There are a number of reasons for that. Because of linenarrowing requirements it is necessary to use high magnification prism beam expander in $F_2$ laser just like in KrF or ArF lasers. For example, the beam expansion coefficient for $F_2$ laser should typically be at least 20X. That requires at least three prisms to be used in beam expander as shown in FIG. 1. Unfortunately, the absorption losses in prisms and losses from the surfaces of the prisms become very big as compared to KrF or ArF lasers. The limited number of materials which can be used for coatings at 157 nm wavelength greatly limits the quality of any anti-reflection coatings which can be applied to surfaces of the prisms in order to reduce the losses. Very high gain of $F_2$ laser produces a very strong amplified spontaneous radiation which increases divergence of the beam and broadens its spectrum. In addition to all that, the reflectivity of eschelle diffraction grating is also smaller at 157 nm as compared to 248 nm or 193 nm wavelengths of KrF or ArF lasers.

Because of all these factors, the typical pulse energy, which such a line-narrowed laser can produce is much less than 5 mJ and is not enough for microlithography applications. In addition to that the lifetime of anti-reflection coatings on optical components, such as prisms is too low, and correspondingly the cost of operation of such a system would be too high.

Therefore, there is a need to develop a more efficient line-narrowing scheme, which would have a higher lifetime of the components and preferably would provide higher pulse energy of line-narrowed light.

SUMMARY OF THE INVENTION

The present invention provides an $F_2$ laser having an etalon-based line narrowing output coupler and a technique for tuning the laser. The etalon based output coupler is adjusted to preferentially reflect a percentage of light at or near the spectral maximum of one of the primary $F_2$ spectral lines and to not reflect light at the other primary $F_2$ spectral line. Thus, a selected range of the selected line is preferentially amplified in the gain medium and the other line is transmitted out of the laser cavity and, therefore, receives no amplification and is suppressed. The result is substantial narrowing in the preferred embodiment of the 157.630 nm line and effective suppression of the 157.523 nm line. Substantial improvement in line narrowing of 157.630 nm line results from a wavelength selective properties of etalon based line-narrowing output coupler.

DETAILED DESCRIPTION OF THE PREFERRED EMBODIMENTS

Figure 1:
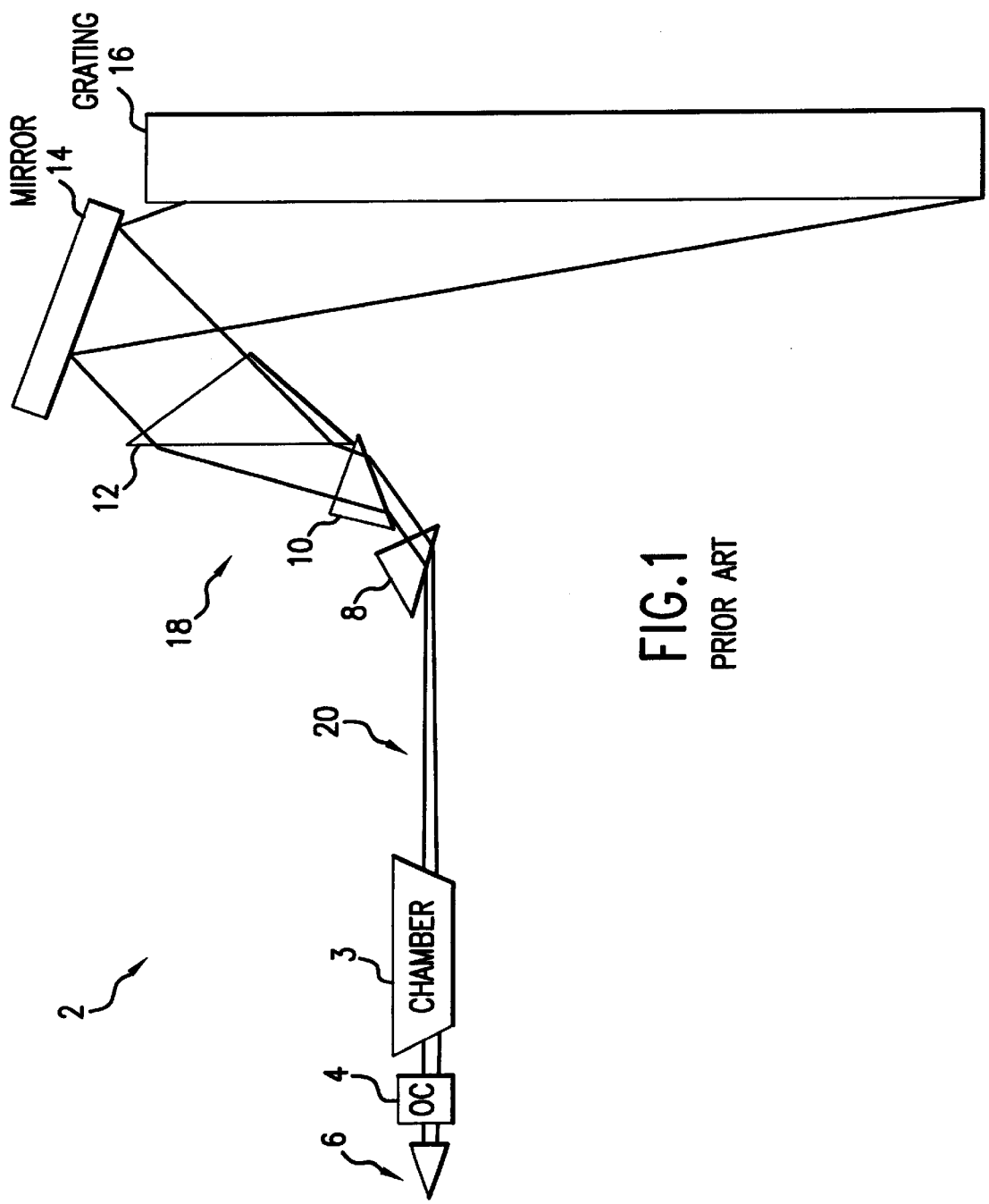
FIG. 1. shows a prior art line-narrowed laser.
Figure 2:
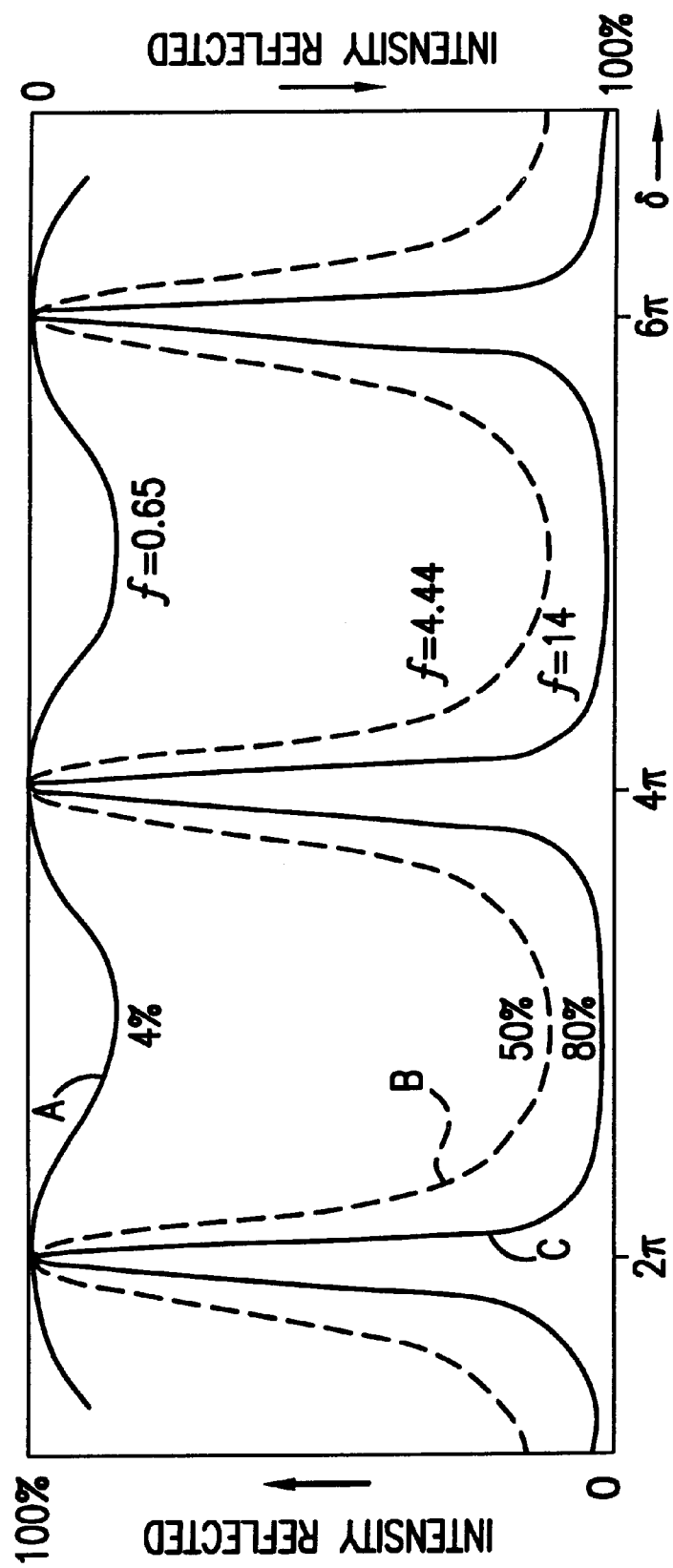
FIG. 2 shows the percent of light transmitted by an etalon as a function of the reflection of the two inner etalon surfaces.
Figure 3:
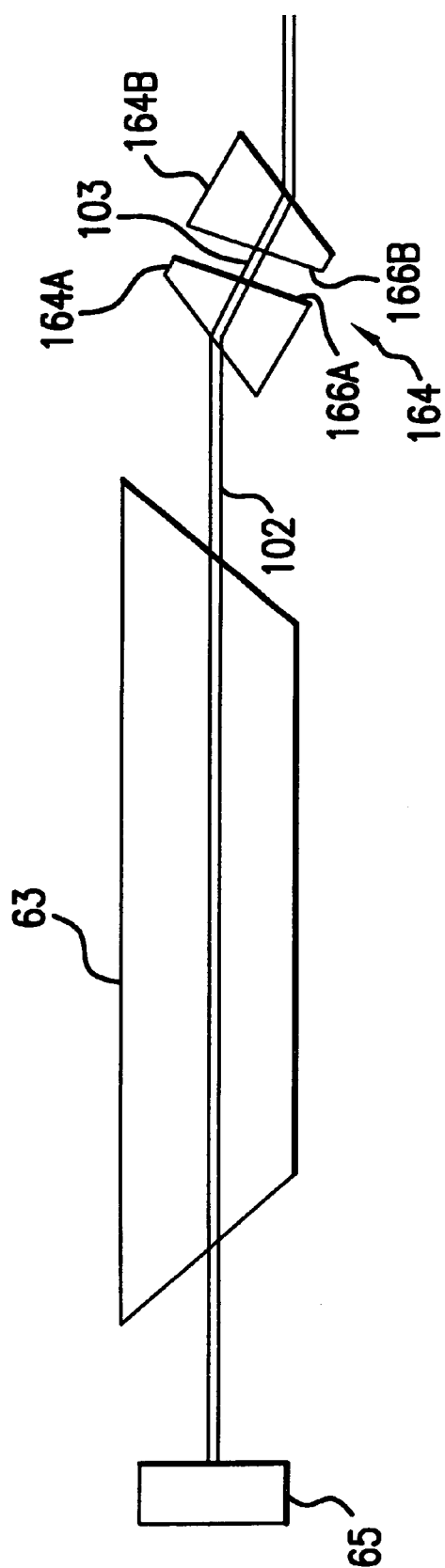
FIG. 3 shows a preferred embodiment of the present invention.

A preferred embodiment of the present invention is shown in FIG. 3. The resonator of the laser comprises high reflecting mirror 65 and an Fabri-Perot etalon 164. The Fabri-Perot etalon consists of two prisms 164A and 164B made out of $CaF_2$. Two sides 166A and 166B of the prisms are made parallel to each with very high precision and separated by a gap. The apex angle of each prism is about 33°. The laser beam 102 enters the prism 164A and is refracted by this prism. The prism 164A is aligned in such a way, that the portion of the beam 102, which exits the prism 164A, exits it at exactly normal incidence angle to the prism surface. The rest of the incoming beam is reflected from the surface 164A straight back. Transmitted portion of the beam 102 is shown as a beam 103. On the entrance surface 166B of the second prism 164B, part of the beam 103 is again reflected straight back and the rest transmits through the prism 164B. Because the beam 103 is exactly perpendicular to both surfaces 166A and 166B, the reflected beam reflects straight back to the laser. Therefore, the Fabri-Perot etalon 164 serves as an output coupler for the laser 60. Both prisms are enclosed in a nitrogen atmosphere at a pressure slightly above 1.0 atmosphere as shown in FIG. 4.

Figure 4:
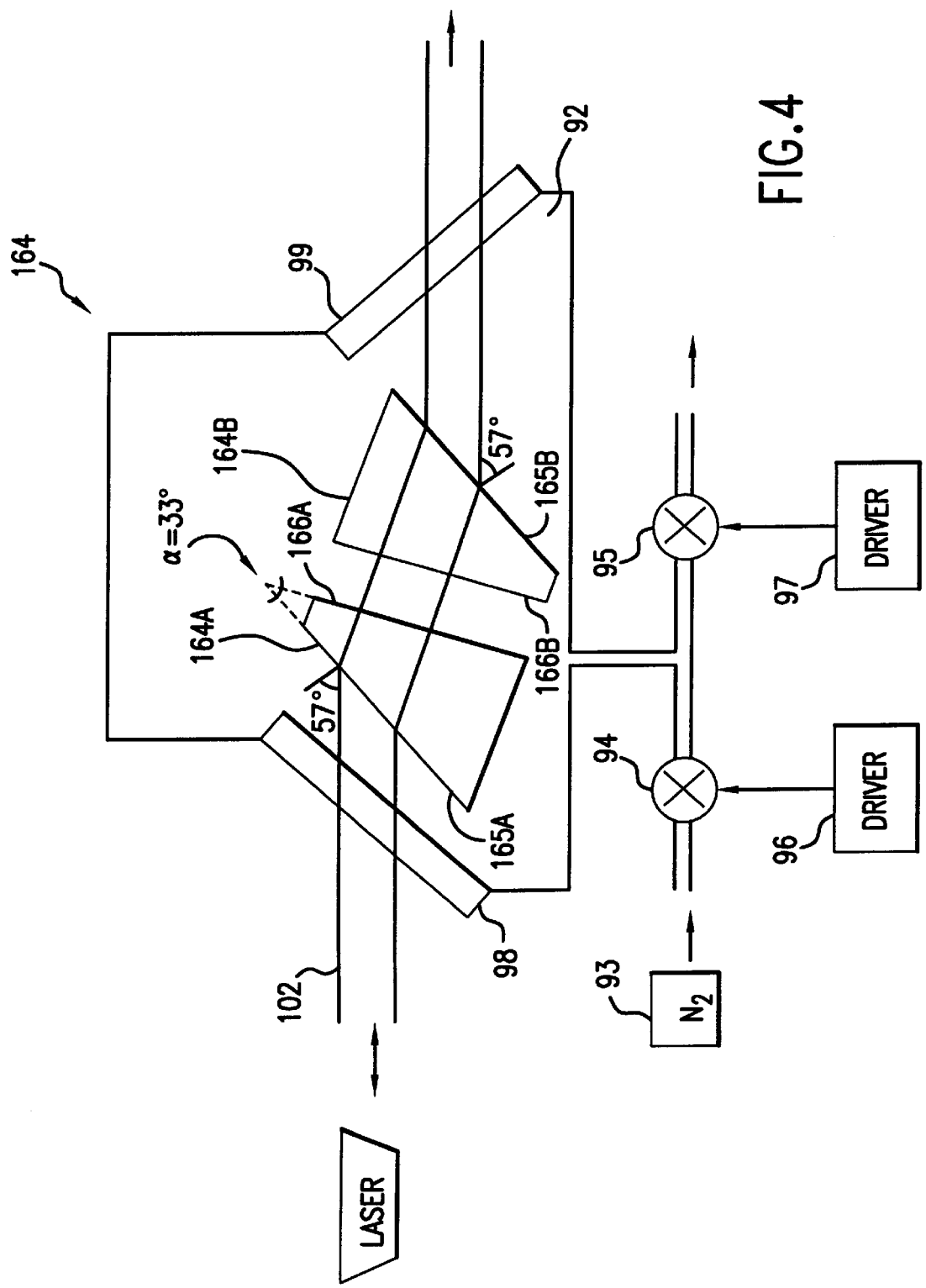
FIG. 4 shows details of a preferred etalon based output coupler.

Referring now to FIG. 4, the beam 102 enters the first prism 164A at an angle of about 57 degrees which is close to Brewster's angle. Therefore, for the beam 102 polarized in the plane of incidence, there will be no reflection from the first surface 165A of prism 164A. The apex angle of prism 164A is about 33 degrees. Therefore, because of refraction of the beam 102 on surface 165A, the propagation direction of beam 102 is changed, so it will cross the second surface 166A of prism 164A at an angle of 90 degrees. The position of the prism is finely aligned so that this angle is exactly 90 degrees. The beam 102 enters the second prism 164B at exactly the same 90 degree angle with surface 166B as surfaces 166A and 166B are parallel to each other. Beam 102 will have another refraction at the second surface 165B of prism 164B, so that the existing beam will make a Brewster's angle of about 57 degrees with the surface 165B. The apex angle of prism 164B is again about 33 degrees. None of the surfaces of prisms 164A and 164B has any coatings. Windows 98 and 99 are positioned at an angle close to Brewster's angle if no reflection is desired from them. Or if a window is used to sample a portion of the beam 102, the angle could be a little less than Brewster's angle. Therefore, the preferred embodiment has no coatings on any of its surfaces.

Each of the uncoated inside parallel surfaces of the prisms has a Fresnel reflectivity of about 4.7 percent for normal incident 157 nm light. These surfaces reflect a portion of beam 102 back to the laser.

More generally where the prism material has an index of refraction $n_m$ and the adjacent gas has an index of refraction $n_a$, the apex angle of the prism is such that $$\sin \alpha = \frac{1}{\sqrt{1+(n_m)^2/(n_a)^2}}. \quad (1)$$

If the prism material is $CaF_2$ with $n_m=1.56$ and the surrounding gas is nitrogen at about one atmosphere with an $n_a=1.0003$, then =32.67 degrees.

Tunable Etalon Output Coupler As Line-Selecting and Line-Narrowing Device

In the preferred embodiment, the reflectivity from each surface of 166A and 166B is about 4.7% as determined by Fresnel reflection from uncoated $CaF_2$ material with a refractive index of $n_m \cong 1.56$. Because of interference of two beams reflected from surfaces 166A and 166B correspondingly, the total reflectivity has a close to sinusoidal dependence on the laser wavelength as described by equation:

$$R = \frac{4 \cdot r \cdot \sin^2\left[\frac{2\pi}{\lambda_l} \cdot n_a \cdot d\right]}{(1-r)^2 + 4 \cdot r \cdot \sin^2\left[\frac{2\pi}{\lambda_l} \cdot n_a \cdot d\right]} \quad (2)$$

where r is reflection from surfaces 166A and 166B equal to 0.047, $n_a$ is refractive index of nitrogen, d is the distance between surfaces 166A and 166B and $\lambda_1$ is the laser wavelength. This dependence is shown in FIG. 5.

The maximum reflectivity is about 17% and the minimum reflectivity is about 0%. The distance between reflection peaks $\lambda_{FSR}$ usually referred to as a free spectral range of the etalon is determined by its gap d, refractive index of nitrogen $N_a$ and laser wavelength $\lambda_1$:

$$\lambda_{FSR} = \frac{\lambda_l^2}{2 \cdot d \cdot n_a} \quad (3)$$

Figure 5:
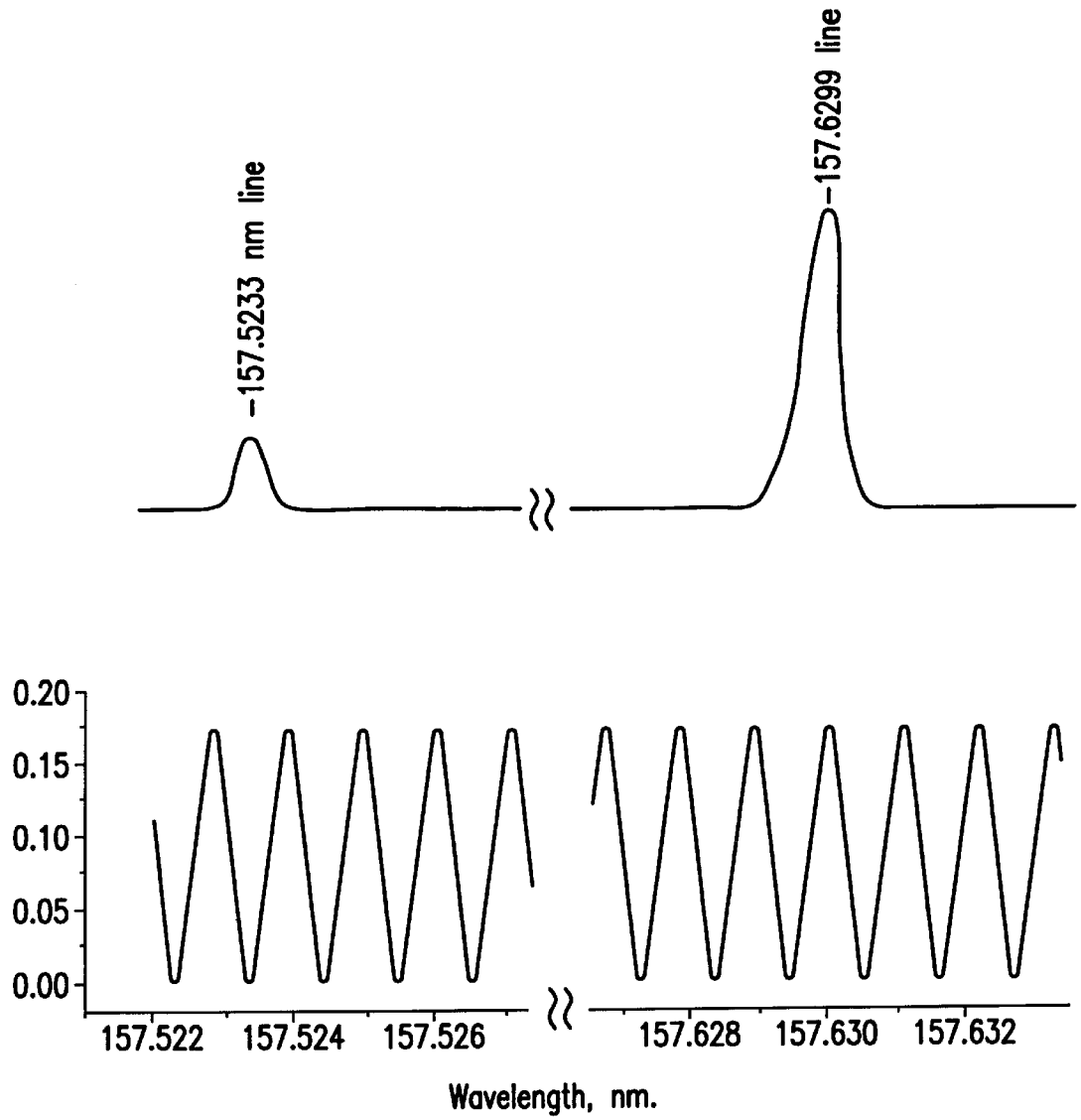
FIG. 5 shows a technique for tuning the output coupler to reflect light a 157.6299 nm and to transmit light at 157.5233 nm.
Figure 6:
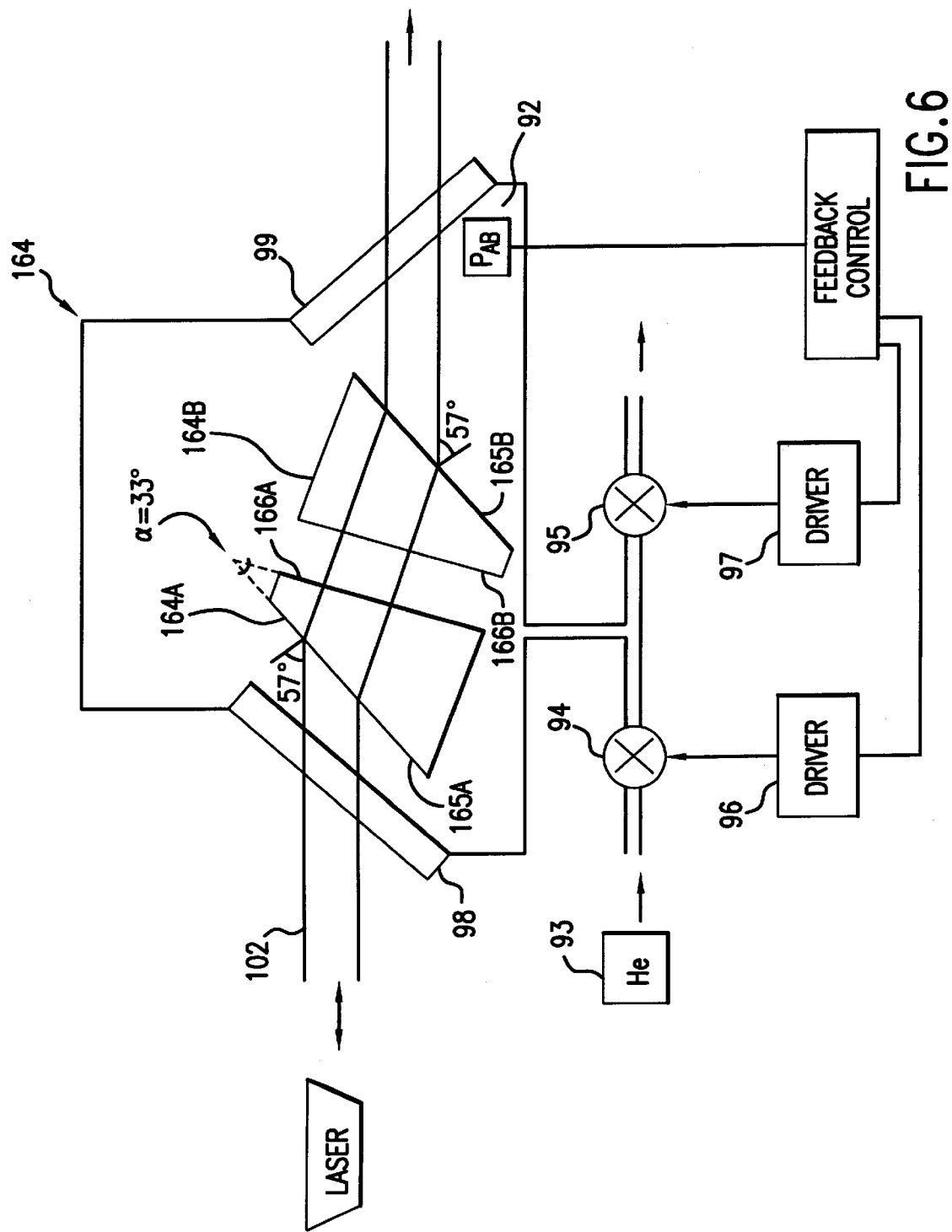
FIG. 6 shows details of the preferred etalon based output coupler with gas pressure control.

The spectrum of $F_2$ laser is also shown in FIG. 5. There are two peaks, each of them has FWHM of about 1.1 pm and they are separated by $\Delta\lambda = 106.6$ nm. The effects of line-selection of the strong line and its simultaneous line-narrowing are achieved in the present embodiment by aligning the etalon output coupler such that one of its peaks lies right at the center of the strong line, and one of its minimums lies right at the center of the weak line. This can be done, if $$\Delta\lambda = (N+1/2) \cdot \lambda_{FSR} \quad (4)$$

where N is 1, 2, 3 . . .

For example, if $\lambda_{FSR} = 1.04$ pm. (and $\Delta\lambda = 106.6$ nm) N=102. Using formula (3) and $N_a = 1.0004$ for pressure about 30% above atmosphere, we obtain that d=11.941 mm. Fine tuning of EOC can be done by adjusting nitrogen pressure. Tuning of EOC Tuning of EOC can be done by changing pressure in chamber 92 (FIG. 4) using inject value 94 and release valve 95. These valves are controlled by drivers 96 and 97 correspondingly. Signals to the drivers are sent by laser onboard computer (not shown).

In one embodiment, the He is used instead of nitrogen, and pressure in the chamber 92 is maintained to the required value. This value is determined at the factory as the most optimum for the output power and spectrum bandwidth. Preferably the percentage of light reflected at the chosen spectral line is between 10 and 17 percent and the light reflected at the other is about 0. The 17 percent reflectivity at the chosen line is obtained when no coatings are used on etalon surfaces. The lower reflectivity can be obtained by applying coatings to etalon surfaces 166A and 166B (FIG. 4) in order to reduce their reflectivity to below that of uncoated surfaces.

Control of the pressure for tuning the EOC can be accomplished using a feedback arrangement based on actual wavelength measurements in the manner described in U.S. Pat. No. 5,856,991 issued Jan. 5, 1999 entitled "Very Narrow Band Laser". That patent is incorporated herein by reference.

A simpler alternate tuning method is to control the pressure of the etalon to a selected absolute pressure in order to keep the etalon adjusted to reflect at a selected wavelength range within the selected $F_2$ line and to transmit at the wavelength of the other line. This technique is possible because the $F_2$ laser of the present invention (unlike prior at KrF and ArF lasers like those described in the '991 patent) can be operated at a narrow band without the use of grating based line narrowing unit which itself must be tuned.

Since both lines of the $F_2$ laser are absolute values, they do not change due to influences such as beam direction in the laser cavity or temperature of laser components. The reflectivity of the etalon (assuming a fixed spacing between the prisms and constant temperature of the etalon gas) are values which depend only on the etalon pressure. Therefore, the etalon can be calibrated in the factory to determine the proper etalon pressure to provide the desired reflectance at the two F2 lines. Then a feedback control can be provided which utilizes an absolute pressure transducer reading etalon pressure in order to keep the etalon gas pressure at the desired pressure. If helium is the etalon gas the index of refraction for the etalon gap is:

$$n_{He} = 1 + 4 \times 10^{-5} \frac{P_{He}}{14.5 \, psi} \quad (5)$$

where $P_{He}$ is the absolute helium pressure in the etalon.

According to equation 2, the peaks and minimums of the reflection curve shown in FIG. 5 shifts in proportion to $n_{He}$; thus the etalon is appropriately sensitive to pressure changes. For example, 1 psi change in absolute pressure will shift the reflectance curve by about 0.4 pm. Absolute pressure transducers are readily available for reading pressures to an accuracy of about 0.02 psi; thus a feedback control using such a transducer could easily control the etalon reflectance to an accuracy of better than 0.01 pm. These absolute pressure transducers are available from suppliers such as Druck, Inc. with offices in New Fairfield, Conn. An acceptable unit would be their Model No. PMP 4000.

Preferably the etalon temperature is regulated to an approximately constant temperature, but an alternative is to measure the temperature and to correct for temperature varation. This is done in accordance with the following formula.

$$n_{He} = 1 + \left(4 \times 10^{-5} \frac{P_{He}}{14.5 \, psi}\right)\left(\frac{T_{STD}(K)}{T_{He}(K)}\right) \quad (6)$$

where $T_{STD}(K)$ is a reference temperature in degrees Kelvin and $T_{He}(K)$ is the helium gas temperature in degrees Kelvin. In this case the constant distance between the surfaces 166A and 166B (FIG. 4) can be maintained by using spacers made out of low expansion material, such as fused silica or ULE glass.

Although this very narrow band laser has been described with a reference to a particular embodiment, it is to be appreciated that various adaptations and modifications may be made. For example, in addition, to pressure-tuned etalons and piezoelectric-tuned etalons, there are commercially available etalons which are compression-tuned using mechanical force to widen or narrow the gap between the plates of the etalon. Etalons with surface reflectances other than 4.7% could be used. Preferably, however, the reflectance of the reflecting surfaces should be between about 1 and about 20%. This corresponds to a range of 4% to 55% in the total etalon reflection according to equation 2. Also, a different apex angle of prisms 164A and 164B can be used. If this apex angle is different from 33 degrees, however, the outside surfaces 165A and 165B of prisms 164A and 164B should have an anti-reflection coating to reduce reflection losses from these surfaces. Particularly, the apex angle can be made as small as 0 degrees, at which point prisms 164A and 164B become flats. It is recommended, however, that the minimum apex angle to be at least 10 arcmin in order to reduce an effect of reflections from these surfaces on laser That which is claimed is:

1. A method of tuning an $F_2$ laser having a first spectral line of about 157.630 nm and a second spectral line at about 157.523 nm, having a gain medium, a tunable etalon based output coupler wherein a portion of light from said gain medium incident on said output coupler is reflected by said output coupler back into the gain medium, and a portion of light from said gain medium is transmitted by said output coupler; said method comprising the steps of:
   A. measuring spectral characteristics of a beam produced by said laser,
   B. tuning said tunable etalon based output coupler to suppress one of the first or second spectral lines and to line narrow the other spectral line to produce desired beam spectral characteristics.

2. A method as in claim 1 wherein the line suppressed is the second spectral line and the line narrowed is the first spectral line.

3. A method as in claim 1 wherein steps of measuring is performed with an etalon based spectrometer.

4. An $F_2$ laser having an etalon based output coupler comprising:
   A. a laser chamber containing laser gas comprising $F_2$ and a noble gas,
   B. a high voltage electric power source to create electric discharge in said laser gas to produce a gain medium,
   C. a resonance cavity comprising a tunable etalon based output coupler for line narrowing a first $F_2$ spectral line and for suppressing a second $F_2$ spectral line.

5. An $F_2$ laser as in claim 4 wherein said etalon based output coupler comprises a Fabri-Perot etalon having reflecting surfaces with reflectance between 10 percent and 17 percent.

6. An $F_2$ laser as in claim 4 wherein said Fabri-Perot etalon is disposed in a pressure controlled pressure chamber.

7. An $F_2$ laser as in claim 6 wherein said pressure chamber is filled with a gas.

8. An $F_2$ laser as in claim 7 wherein said gas is nitrogen.

9. An $F_2$ laser as in claim 7 wherein said gas is helium.

10. An $F_2$ laser as in claim 6 wherein said gas is chosen from a group consisting of nitrogen or any of the noble gases.

11. A method of tuning an $F_2$ laser output wavelength having a first nm spectral line of about 157.630 nm and a second spectral line at about 157.523 nm, having a gain medium, a tunable etalon based output coupler wherein a portion of light from said gain medium incident on said output coupler is reflected by said output coupler back into the gain medium, and a portion of light from said gain medium is transmitted by said output coupler; said method comprising the steps of:
   A. calibrating said laser output wavelength as a function of absolute etalon gas pressure,
   B. regulating the absolute pressure of the etalon based output coupler to maintain suppress one of the first or second spectral lines and to line narrow the other spectral line to produce desired beam spectral characteristics.

12. A very narrow band $F_2$ laser comprising:
   A. a laser chamber containing:
      (1) two elongated electrodes, and
      (2) a laser gas comprising $F_2$,
   B. an output coupler comprising an etalon, said output coupler being adjusted to suppress and $F_2$ spectral line and to line narrow the other $F_2$ spectral line.

13. An $F_2$ laser as in claim 12 and further comprising a wavemeter and a wavelength controller for controlling the output coupler.

14. An $F_2$ laser as in claim 2 wherein said etalon is a pressure-tuned etalon containing an etalon gas.

15. An $F_2$ laser as in claim 14 and further comprising a pressure transducer for measuring gas pressure in said output coupler.

16. An F2 laser as in claim 15 wherein said laser comprises a tuning means for tuning said laser by controlling gas pressure of said output coupler based on feedback signals from said pressure transducer.

17. An $F_2$ laser as in claim 16 wherein said etalon gas is helium.

18. An $F_2$ laser as in claim 17 wherein said laser comprises a temperature correction means for applying a temperature correction for temperature variations in said etalon gas.

19. An $F_2$ laser as in claim 12 wherein said etalon is a piezoelectric-tuned etalon.

20. An $F_2$ laser as in claim 12 wherein said etalon is a compression-tuned etalon.

21. An $F_2$ laser as in claim 12 wherein said etalon defines two internal parallel surfaces, both of which are free to any coating.

22. An $F_2$ laser as in claim 12 wherein said etalon defines two internal parallel surfaces separated by a spacer means comprised of low thermal expansion material.

23. An $F_2$ laser as in claim 12 wherein said etalon comprises two prisms each prism having a first surface parallel to a first surface of the other prism and each prism having a second surface at approximately Brewster's angle with an axis of a laser beam from said laser.

* * * * *

UNITED STATES PATENT AND TRADEMARK OFFICE
CERTIFICATE OF CORRECTION

PATENT NO. : 6,240,110 B1
DATED : May 29, 2001
INVENTOR(S) : Ershov

It is certified that error appears in the above-identified patent and that said Letters Patent is hereby corrected as shown below:

Column 1,
Line 5, after "Dec. 21, 1998" insert -- , now U.S. Pat. No. 6,137,821, --.
Line 8, after "Jul. 1, 1997" insert -- , now U.S. Pat. No. 5,970,082 --.

Column 8,
Line 7, after "output coupler to" delete "maintain".
Line 16, after "suppress" change "and" to -- an --.

Signed and Sealed this

Eighteenth Day of October, 2005

JON W. DUDAS
*Director of the United States Patent and Trademark Office*